United States Patent [19]
Acocella et al.

[11] Patent Number: 5,591,941
[45] Date of Patent: Jan. 7, 1997

[54] SOLDER BALL INTERCONNECTED ASSEMBLY

[75] Inventors: John Acocella, Hopewell Junction, N.Y.; Donald R. Banks, Pflugerville, Tex.; Joseph A. Benenati, Hopewell Junction; Thomas Caulfield, Croton Fall, both of N.Y.; Karl G. Hoebener, Georgetown, Tex.; David P. Watson, Beaverton, Oreg.; John S. Corbin, Jr., Austin, Tex.

[73] Assignee: International Business Machines Corporation, Armonk, N.Y.

[21] Appl. No.: 144,981

[22] Filed: Oct. 28, 1993

[51] Int. Cl.⁶ .................................................. H06K 1/14
[52] U.S. Cl. ........................ 174/266; 174/262; 174/261; 439/83; 257/737; 257/738; 361/767; 361/768; 361/770; 361/777
[58] Field of Search ............................... 174/260, 261, 174/262, 266, 267; 361/767, 768, 770, 777, 778, 808; 439/78, 83; 257/737, 738

[56] References Cited

U.S. PATENT DOCUMENTS

| | | |
|---|---|---|
| 3,401,126 | 9/1968 | Miller et al. |
| 3,403,438 | 10/1968 | Best et al. |
| 3,429,040 | 2/1969 | Miller. |
| 3,518,756 | 7/1970 | Bennett et al. |
| 3,554,877 | 1/1971 | Geisler. |
| 3,701,076 | 10/1972 | Irish ........................ 339/17 C |
| 3,791,858 | 2/1974 | McPherson et al. ........ 117/201 |
| 3,988,405 | 10/1976 | Smith et al. ................ 264/63 |
| 4,132,341 | 1/1979 | Bratschun ................ 228/122 |

(List continued on next page.)

FOREIGN PATENT DOCUMENTS

| | | |
|---|---|---|
| 0084464 | 7/1983 | European Pat. Off. |
| 0263222 | 10/1986 | European Pat. Off. |
| 0248566 | 5/1987 | European Pat. Off. |
| 2177641 | 7/1984 | United Kingdom. |

OTHER PUBLICATIONS

IBM Technical Disclosure Bulletin, vol. 29, No. 4 Sep. 1986.

"Copper Ball Standoff For Surface–Mounted Attachment Of MLC Substrates On Laminates".

IBM Tech. Disc. Bull. vol. 20 No. 8 Jan. 78' High Performance Package pp. 3090–3091.

IBM Tech. Disc. Bull, vol. 18 No. 5 Oct. 75' Semiconductor Device Carrier For Modules pp. 1440–1441.

(List continued on next page.)

*Primary Examiner*—Laura Thomas
*Attorney, Agent, or Firm*—Michael E. Belk

[57] ABSTRACT

High melting temperature Pb/Sn 95/5 solder balls are connected to copper pads on the bottom of a ceramic chip carrier substrate by low melting temperature eutectic Pb/Sn solder. The connection is made by quick reflow to prevent dissolving Pb into the eutectic solder and raising its melting temperature. Then the module is placed on a fiberglass-epoxy circuit board with the solder balls on eutectic Pb/Sn solder bumps on copper pads of the board. The structure is reflowed to simultaneously melt the solder on both sides of the balls to allow each ball to center between the carrier pad and circuit board pad to form a more symmetric joint. This process results in structure that are more reliable under high temperature cycling. Also, to further improve reliability, the balls are made as large as the I/O spacing allows without bridging beam on balls; the two pads are about the same size with more solder on the smaller pad; the pads are at least 75% of the ball diameter; and the eutectic joints are made as large as possible without bridging between pads. For reliability at even higher temperature cycles or larger substrate sizes columns are used instead of balls.

28 Claims, 8 Drawing Sheets

U.S. PATENT DOCUMENTS

| | | | |
|---|---|---|---|
| 4,202,007 | 5/1980 | Dougherty et al. | 357/80 |
| 4,413,309 | 11/1983 | Takahashi et al. | 361/406 |
| 4,545,610 | 10/1985 | Lakritz et al. | 29/589 |
| 4,604,644 | 8/1986 | Beckhan et al. | 357/80 |
| 4,681,654 | 7/1987 | Clementi et al. | 156/630 |
| 4,701,482 | 10/1987 | Itoh et al. | 523/435 |
| 4,831,724 | 5/1989 | Elliott | 29/840 |
| 4,845,542 | 7/1989 | Bezuk et al. | 357/68 |
| 4,914,814 | 4/1990 | Behum et al. | 29/843 |
| 4,999,699 | 3/1991 | Christie et al. | 357/65 |
| 5,060,844 | 10/1991 | Bebun et al. | 228/180.2 |
| 5,120,678 | 6/1992 | Moore et al. | 437/183 |
| 5,133,495 | 7/1992 | Angulas et al. | 228/180.1 |
| 5,147,084 | 9/1992 | Behun et al. | 228/56.3 |
| 5,159,535 | 10/1992 | Desai et al. | 361/398 |
| 5,201,451 | 4/1993 | Desai et al. | 228/5.5 |
| 5,203,075 | 4/1993 | Angulas et al. | 29/830 |
| 5,241,133 | 8/1993 | Mullen, III et al. | 174/52.4 |
| 5,261,155 | 11/1993 | Angulas et al. | 29/830 |
| 5,371,328 | 12/1994 | Gutierrez et al. | 174/261 |
| 5,379,189 | 1/1995 | Merriman | 361/760 |
| 5,386,624 | 2/1995 | George et al. | 29/832 |

OTHER PUBLICATIONS

IBM Tech. Disc. Bull. vol. 33 No. 2 Jul. 90' Thermal Fatigue–Resistant Joint For I/C Packaging Applications p. 253.

Sloan et al. Oven Molded Padarray Carrier (OMPAC) "A New Kid on the Block" Motorola, Inc.; PO Box 6000; Austin, TX 78762 Feb. 93.

Costlay, T. "Ball Grid Arrays: The Hot New Package" in *Electronic Engineering Times* Mar. 15, '93 pp. 35,6.

Derman, G. "Solder Balls Make Connections" *In Electronic Engineering Times* Mar. 15, 93' p. 37.

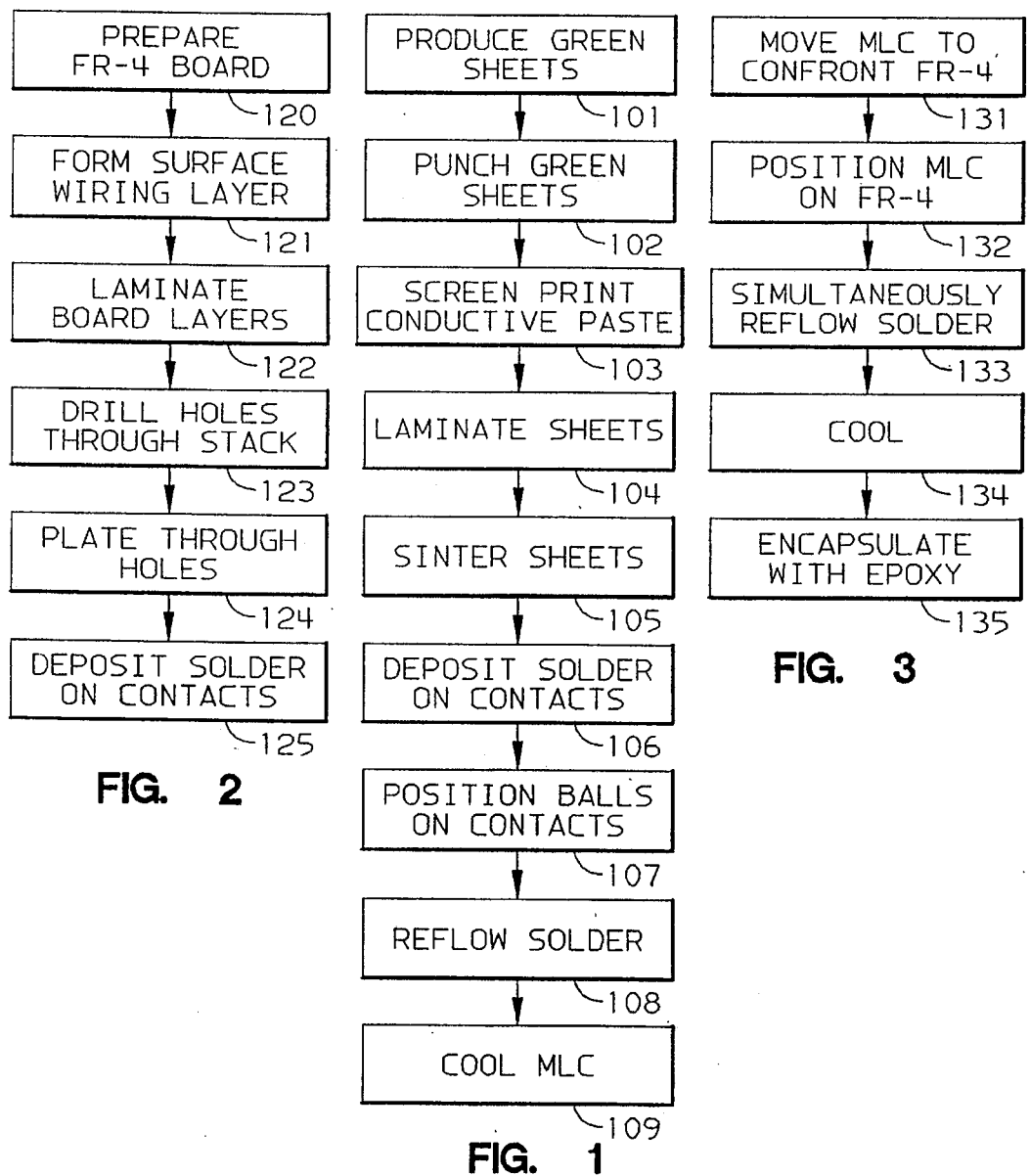

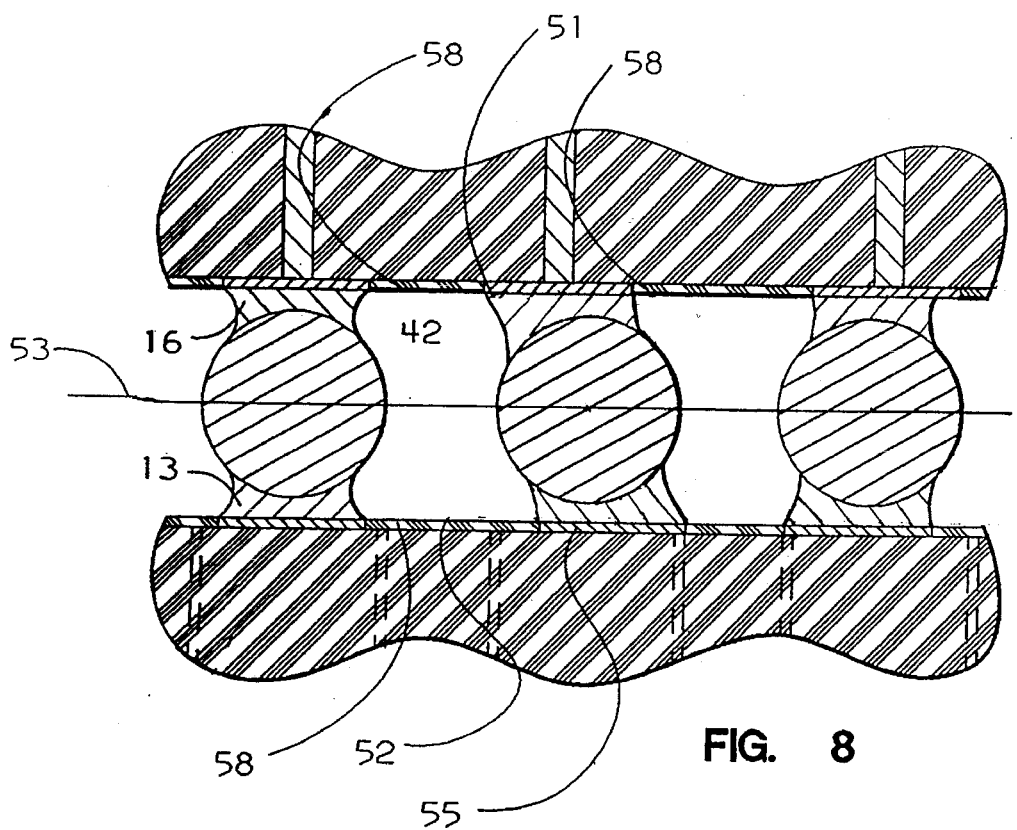
FIG. 8
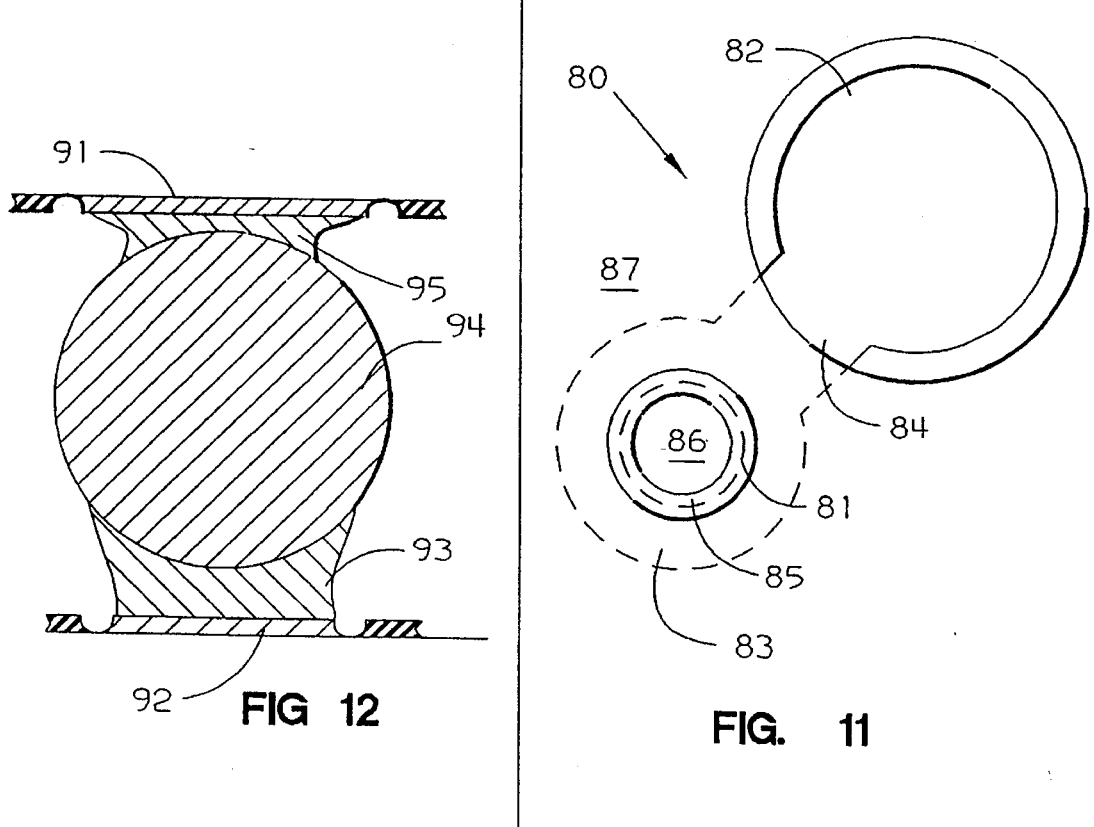
FIG 12
FIG. 11

FIG. 9
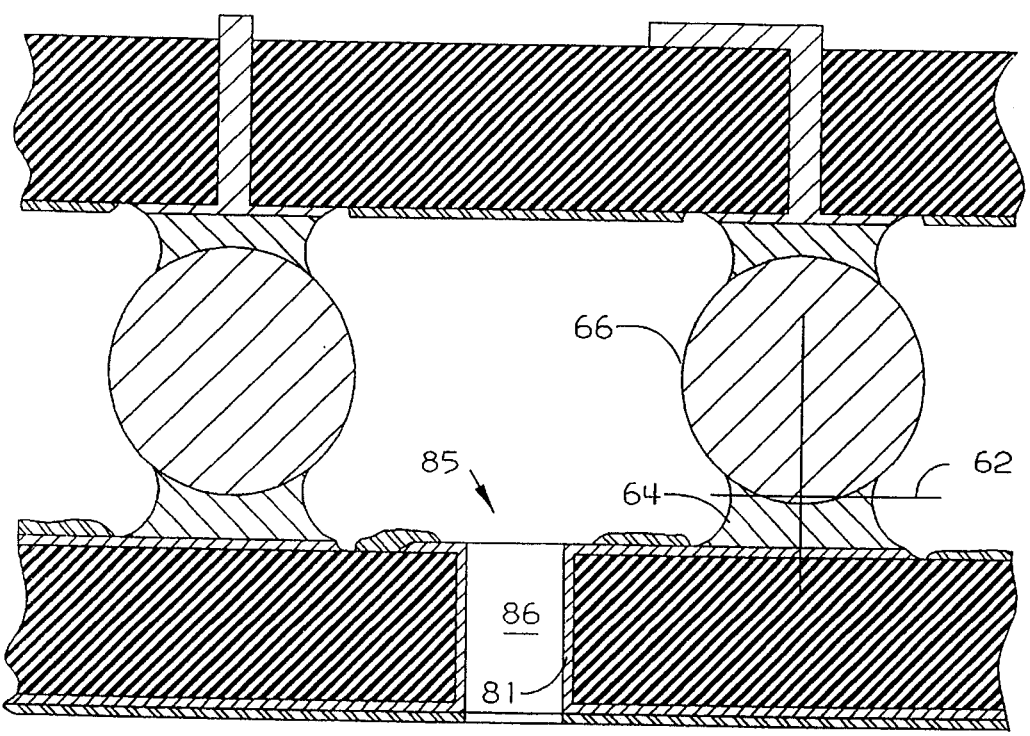
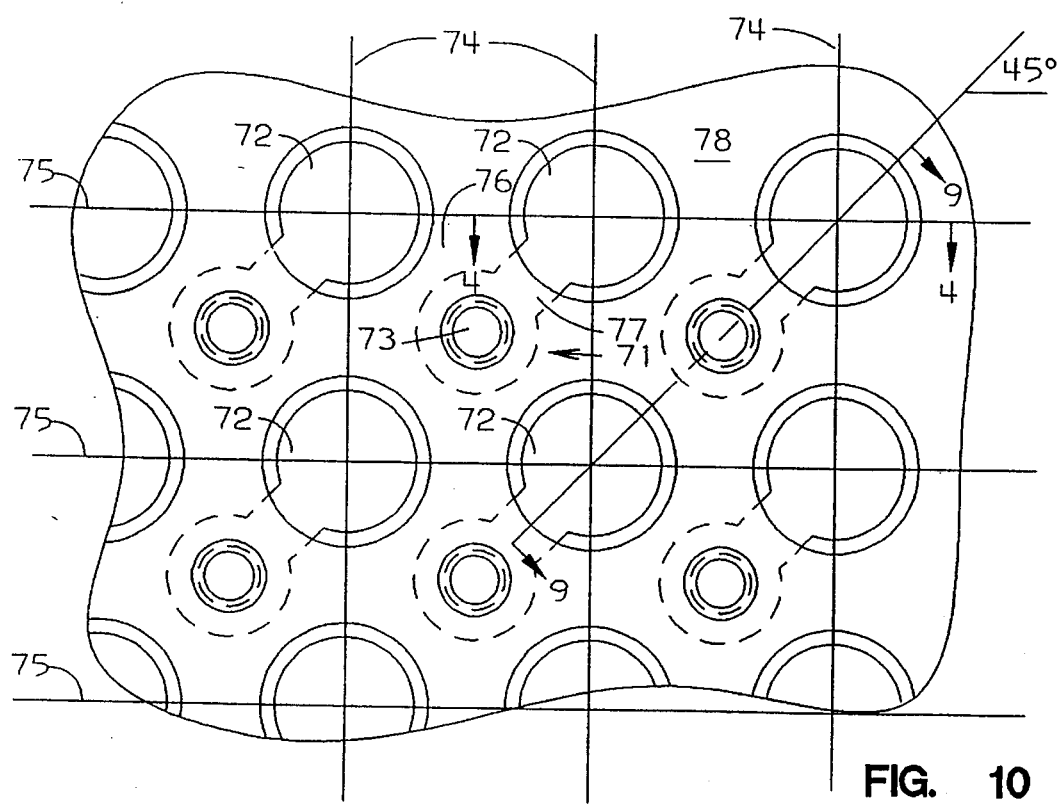
FIG. 10

SOLDER BALL INTERCONNECTED ASSEMBLY

FIELD OF THIS INVENTION

This invention relates to the field of information handling systems and specifically to second level packaging in which chip carrier modules are attached to circuit boards and more specifically to surface mount attachment of ceramic modules to organic circuit boards.

BACKGROUND OF THIS INVENTION

In the related field of first level packaging solder connections have been used for mounting ICs (integrated computer chips) using the C-4 (controlled collapse chip connection) technology since first described in U.S. Pat. Nos. 3,401,126 and 3,429,040 by Miller. Packaging Electronic Systems by Dally (McGraw-Hill 1990 p. 113) describes flip chip or C-4 connections. In Dally, "Chip bond pads are deployed in an area array over the surface of the chip . . . These bonding pads are 5 mil in diameter on 10 mil centers. Matching bonding pads are produced on a ceramic substrate so that the pads on the chip and the ceramic coincide. Spheres of solder 5 mil in diameter are placed on the ceramic substrate pads . . . and the chip is positioned and aligned relative to the substrate. The assembly is heated until the solder spheres begin to soften and a controlled collapse of the sphere takes place as the solder simultaneously wets both pads. A myriad of solder structures have been proposed for mounting IC chips as well as for interconnection to other levels of circuitry and electronic packaging." Ceramic is used as a substrate because it has a thermal coefficient of expansion (TCE) which is close to that of the silicon IC chips.

In the field of second level packaging "Ball Grid Arrays: The Hot New Package" by Terry Costlow and "Solder Balls Make Connections" by Glenda Derman both in *Electronic Engineering Times* Mar. 15, 1993, describe using solder balls to connect ceramic or flexible chip carriers to circuit boards.

U.S. Pat. No. 4,132,341 to Bratschum describes the self-centering action of conductors spanning between solder pads of two components when both pads are simultaneously reflowed. U.S. Pat. No. 4,831,724 describes the self-centering of a component when it is vibrated during reflow.

Fabrication of multi-layer ceramic chip carriers is described in U.S. Pat. Nos. 3,518,756; 3,988,405; and 4,202,007 as well as "A Fabrication Technique For Multi-Layer Ceramic Modules" by H. D. Kaiser et al., *Solid State Technology*, May 1972, pp. 35–40 and "The Third Dimension in Thick-Films Multilayer Technology" by W. L. Clough, *Microelectronics*, Vol. 13, No. 9 (1970), pp. 23–30.

Fabrication of multi-layer circuit boards is described in U.S. Pat. Nos. 3,554,877; 3,791,858; and 3,554,877. Thin film techniques are described in U.S. Pat. No. 3,791,858.

U.S. Pat. No. 4,604,644 to Beckham describes materials and structures for encapsulating C-4 connections. U.S. Pat. No. 4,701,482 to Itoh and U.S. Pat. No. 4,999,699 to Christie et al. disclose epoxies and guidance in selecting epoxies for electronic applications.

Flexible film chip carriers (known in the art as ATAB or TAB-BGA) are described in U.S. Pat. Nos. 4,681,654; 4,766,670 and 5,159,535. In ATAB (area tape automated bonding) a flexible circuit board chip carrier is mounted on a circuit board using solder-ball connect.

U.S. Pat. No. 5,147,084 to Behun, describes using a HMP (high melting point) solder ball in association with a LMP (low melting point) solder. FIG. 1A of that patent is similar to FIG. 4 of this application. "A part 10 is to be joined to a board 11. Part 10 has internal metallurgy 14 which terminates at the surface at a bonding pads 12. A . . . LMP solder 16 is applied to a bonding pad 12. A . . . HMP solder ball 18 is placed in contact with LMP solder 16 and the assembly is heated to reflow the LMP solder which then wets to the non-molten HMP solder ball . . . Board 11 is also illustrated with internal metallurgy 15, terminating on the surface bonding pad 17 . . . the assembled part 10 . . . is brought into contact with part 11 having pad 17 and LMP solder 13, and the two are heated to a temperature sufficient to reflow the LMP solder but not sufficient to melt the HMP solder ball. The LMP solder 13 which is attached to the bonding pad 17, on board 11, will wet the HMP ball and connection will be achieved."

All the above sources are hereby incorporated by reference.

OBJECTS OF THIS INVENTION

In the invention of applicants, high melting temperature (HMT) preforms (balls or columns) connect between a grid array of contacts on the bottom of a component and a mirror image grid array of contacts on the top surface of an organic substrate to form an electrical interconnect structure. Low melting temperature (LMT) joining material connects between the HMT preforms and the contacts. The invention includes the compositions of the HMT preforms and LMT joining material, the specific geometry of the connections, organic circuit boards and ceramic chip carriers for such interconnections, the process for producing such boards and carriers, and the process for attaching the carriers to the boards. In this description "solder-ball connection" refers to using LMT joining materials to mechanically and electrically connect HMT preforms on a component to conductive contacts on a substrate.

Therefore, it is an object of this invention to provide a process for manufacturing a reliable interconnect assembly using HMT solder-ball connection.

More specifically, it is an object to connect two rigid, confronting substrates using HMT solder-ball connections to form an electronic packaging structure.

It is another object of this invention to provide a method of reflow soldering to produce solder-ball connections.

It is another object of this invention to provide methods for producing a component for solder-ball connection.

It is another object of this invention to provide methods of positioning solder-balls on such a component and reflow joining solder-balls to the component for use in solder-ball connection.

It is another object of this invention to provide a method of selecting HMT solder-ball size, selecting contact size, and selecting LMT solder volume.

It another object of this invention to provide a method of producing metal contacts on substrates for solder-ball connection.

Furthermore, it is an object of this invention to provide a reliable interconnect assembly in which HMT metal-balls are connected between mirror image arrays of contacts of two rigid, confronting substrates.

It is more specifically an object of this invention to define reliable LMT solder joint configurations between the balls and contacts.

It is another object of this invention to define ball sizes and contact sizes required for reliable connection.

It is another object of this invention to define HMT ball materials and LMT solder materials which permit reliable connections to be made.

It is another object of this invention to define substrates which may be used for reliable HMT solder-ball connection.

It is another object of this invention to define structures in a surface wiring layer of a substrate to connect between PTHs (plated through-holes) and connection pads for controlling LMT solder volumes for the joints between the pads and HMT solder-balls.

Finally, it is an object of this invention to describe an information handling system using the connections of the system.

SUMMARY OF THIS INVENTION

In this invention of applicants, it was discovered that solder-ball connections between confronting metal contact grids on rigid substrates which were made using a process similar to that which was used for ATAB were not reliable due to thermal fatigue of the solder joints between the balls and the contacts. It was discovered that the joints were not all symmetrical due to mis-registration of contacts (allowable tolerances in contact location) causing misalignment between confronting contacts, and that the joints could be made more symmetrical and more reliable by simultaneously reflowing the top and bottom LMT solder joints between each HMP metal-ball and both respective contacts of the ball. This allows the balls to be moved by surface tension of the melted solder to more symmetrical positions between the centers of the contacts within the plane defined by the array of the solder-balls.

It was discovered that making the balls larger reduces fatigue, but that the size of the balls is constrained by the specified interconnection spacing and a nominal spacing between balls necessary to reliably prevent electrical connection from developing between the balls. Similarly, it was discovered that making the contacts larger reduces fatigue, but the size of the contacts are constrained by the specified interconnect spacing and the nominal spacing between contacts necessary to reliably prevent electrical connection from developing between contacts (e.g. solder bridging). For reliable interconnections fatigue is minimized by making the balls slightly smaller than the spacing between contacts and making the contacts slightly smaller than the balls. It was discovered that the reliability of the connections were affected by the relative size between the contacts on either side of each ball and that fatigue could be minimized by making the contacts equal sized. It was discovered that fatigue could be minimized, for different sized contacts on each side of the ball, by making the solder volume larger for the joint with the smaller contact.

It was discovered that increasing the cross section of the solder joints reduced fatigue but the volume increase is constrained by the necessity to reliably prevent solder bridging from developing between adjacent balls and between adjacent contacts. Finally it was discovered that reducing the cross section of the solder joints below about ⅔ of the diameter of the ball has a remarkably deleterious effect on the fatigue life of the connection.

BRIEF DESCRIPTION OF THE DRAWINGS

FIG. 1 is a process diagram which illustrates producing a multi-layer ceramic chip carrier (MLC) of this invention.

FIG. 2 illustrates the process for producing a fiberglass-epoxy circuit board (e.g. FR-4) of this invention.

FIG. 3 illustrates the process for producing the connections between the MLC and FR-4 in this invention.

FIG. 8 illustrates the reflow connections of the MLC to the FR-4 of FIG. 4 in which both joints of each connection are simultaneously melted to provide a more symmetric connection.

FIG. 9 is a schematic cross section through line 9—9 of FIG. 10, illustrating the "dog bone" connection between plated-through-hole via connection of this invention.

FIG. 10 is a schematic plan view illustrating part of the array of metal contacts and "dog bone" connections between the plated through-holes and contacts.

FIG. 11 is larger view of the "dog-bone" arrangement of FIG. 10.

FIG. 12 is another embodiment of this invention with different sized contacts and inversely proportional solder volumes.

DESCRIPTION OF EMBODIMENTS INCLUDING THE BEST MODE

Figure 4:
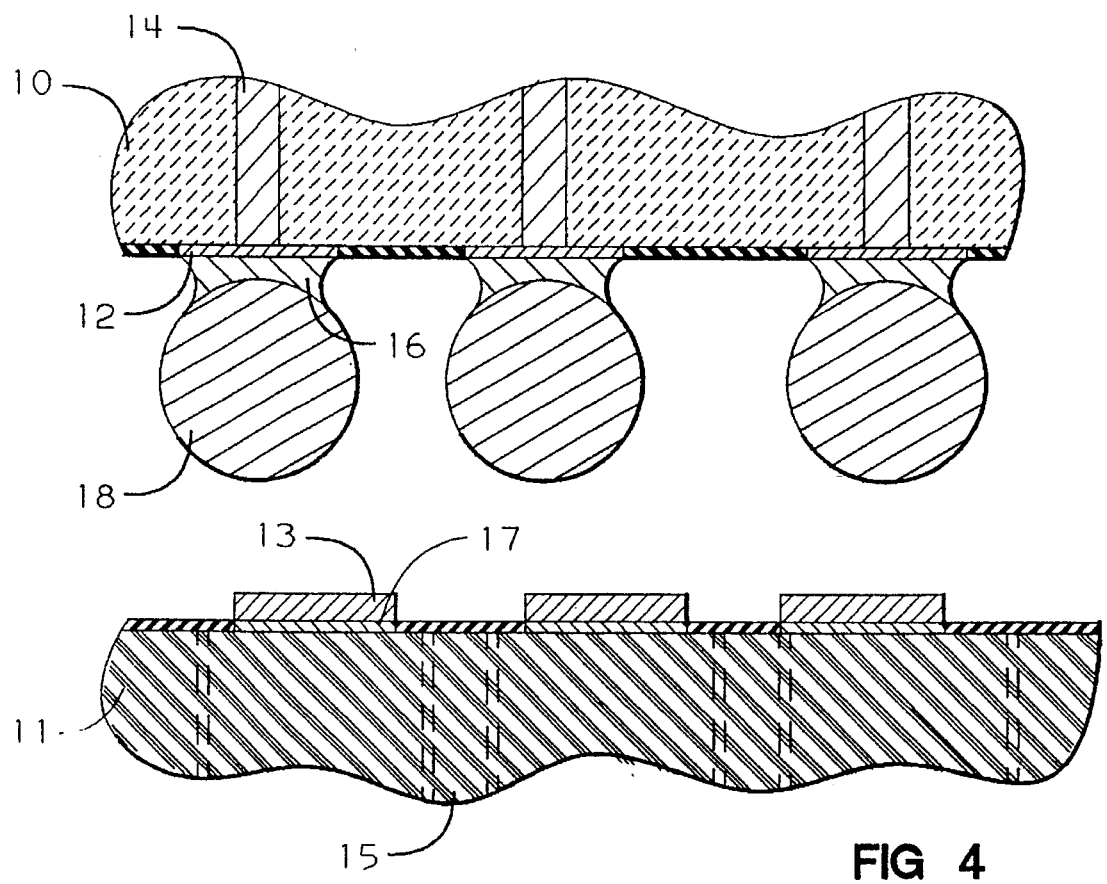
FIG. 4 is a schematic partial cross section through line 4—4 of FIG. 10 of a specific embodiment of this invention showing part of an MLC chip carrier with solder-balls attached to contacts and confronting mirror image contacts of an FR-4 circuit board.

In this invention, as illustrated in FIG. 4, a first substrate 10 is produced with a planer array of contacts 12 and vias 14. In this application substrate refers to any component with a flat surface for interconnection which will be referred to as a major surface in contrast to a narrow edge surface. Although the invention will increase the reliability of connecting flexible circuit boards such as TAB-BGA (tape automated bonding ball grid array) previously known as ATAB components, preferably the first substrate is a rigid component such as an FR-4 or plastic chip carrier, and more preferably a ceramic or MLC (multi-layer ceramic) chip carrier for which these inventions of this application are especially well suited.

As illustrated in FIG. 1, step 101, in the manufacture of ceramic chip carriers, ceramic powders are mixed with binders, solvents and plasticizer and cast to form green sheets of dielectric layers. In step 102, vias are made preferably by punching and in step 103, conductive ink or paste (e.g. Mo frit and solvent) is screened to fill the vias. The wiring pattern may also be screened on the surface at this time and/or exterior wiring layers may be made later using a thin film process. For multi-layer ceramic, in step 104, green sheets are stacked and laminated with heat and pressure into a monolithic structure. Then the green sheet(s) are sintered, in step 105, by firing in an oven with a reducing atmosphere. After sintering the exposed metal is coated for protection (not shown). A thin film process may be used to produce an exterior wiring layer (not shown). For example, conductive metal may be evaporated or sputtered onto the substrate followed by photo-lithographic patterning which may be followed by dialectic coating and additional thin film layering.

The contacts 12 (FIG. 4) may be square or more preferably are approximately round to match the shape of the ball and to allow a closer spacing sufficient to reliably prevent solder bridging. The contacts may be made from any conductive substance, preferably a metal such as Al or Ti and more preferably are made from or covered with Cu, Ni, Au, Pd, or alloys of these. The material may be deposited by screening or a photo-lithographic process may be followed by chemical and/or electric deposition processes.

In step 106 (FIG. 1), the contacts 12 are covered with a volume of a first joining-material 16, such as a conductive thermoplastic or a solder alloy containing Sn, Pb, Bi, In, Ag to form solder contacts or solder bumps of LMT material. In the preferred embodiment the joining-material is Pb/Sn based solder with 20% to 75% Sn and the balance mostly Pb and most preferably is about eutectic 63% Sn and 37% Pb. The LMT solder may be deposited in the molten state by a mass soldering method such as wave soldering or may be screened as solder paste (metal particles in a organic carrier) or may be electrically and/or chemically deposited on the contacts following a photo-lithographic process.

Figure 5:
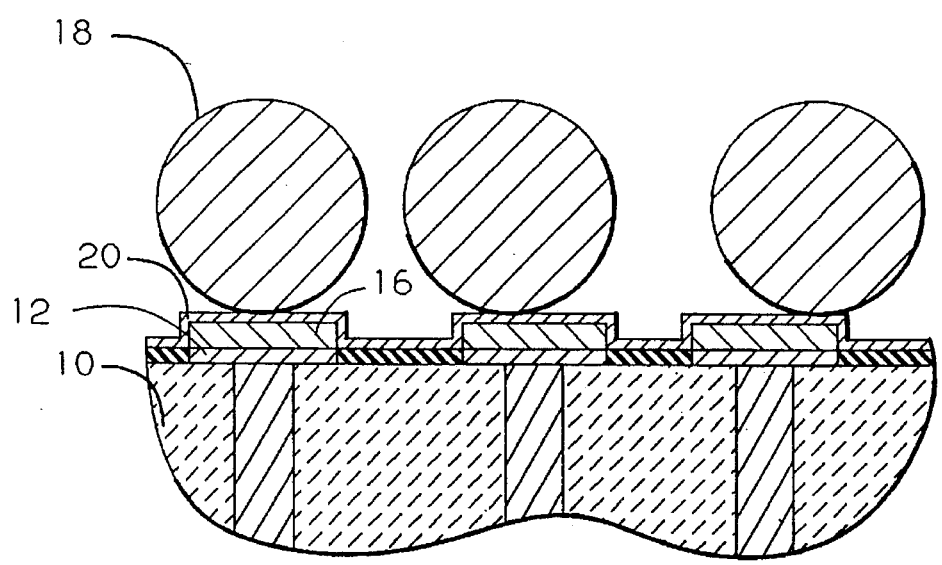
FIG. 5 shows the positioning of solder-balls on the solder contacts prior to attachment to the MLC of FIG. 4.

In step 107 (FIG. 1), as shown in FIG. 5, metal-balls are attached to the solder bumps preferably by applying a layer of sticky flux 20 on which the balls are positioned. The balls may be placed simultaneously by transfer from a vacuum die. The flux may be applied just on the contacts or on the entire area of the substrate interconnections. The balls 18 may be copper preferably coated to prevent oxidation, or more preferably are a HMT solder alloy with a melting temperature substantially higher than that of the joining-material so that the balls may be reflow joined to the contacts in step 108 without melting the balls. Preferably the balls are Sn and 80% to 97% Pb, and most preferably 90%–95% Pb. Preferably the attachment is made reliable by reflow heating to join the ball to the contact so the ball will not fall off during later processing. During reflow of the first joining-material 16, surface tension of the melted joining-material will move the balls 18 from positions shown in FIG. 5 into precise alignment with contacts 12 as shown in FIG. 4. Centering the balls on the pads of the first substrate helps align the balls with the pads 17 of the second substrate 11.

For solder joining-materials, during reflow, metal elements will dissolve or be transported between the LMT solder and the metal-balls. In order to minimize this the reflow attachment of the balls 18 to substrate 10 should be done at the lowest temperature and in the shortest time required to prevent losing the balls during subsequent processing.

In step 109 the substrate is cooled to solidify the joining-material.

As shown in FIG. 4, a second substrate 11 is produced which also has vias 15 and a planer array of contacts 17. The array of contacts 17 is approximately a mirror image of the array of contacts 12. The second substrate may be a flexible circuit board (e.g. thin polyimide and copper layers), or more preferably a rigid board such as ceramic and is most preferably a multi-layer FR-4 printed circuit board. These inventions of this application are especially well suited to applications where there is a significant difference in the thermal coefficients between rigid first and second substrates.

FIG. 2 illustrates the process of manufacturing fiberglass-epoxy circuit boards (e.g. FR-4). In step 120, one or more layers of fiberglass cloth are impregnated with epoxy resin solution to form a dielectric layer. For boards with multiple FR-4 layers, the layers are only partially cured to form stable B-stage layers. In step 121, at least the internal layers are circuitized. FIGS. 9–13 illustrate the surface wiring of this invention and is discussed in more detail later. This step includes forming a rectangular array of preferably round contacts, and forming lands for connection to the vias at the centers of squares defined by four surrounding contacts, and forming connections between the lands and contacts. Usually before drilling to form vias that go through all the layers, the B-stage layers are laminated in step 122 with heat and pressure to fuse the layers and fully cure the boards. Each layer is circuitized by screening or by a photolithographic process in which a metal foil covering is subtractively removed or metal is chemically and/or electrically added selectively to form a wiring layer on the surface of the dielectric layer. In step 123, holes are drilled at the lands, through one or more layers, and in step 124, the holes are internally plated with metal (preferably copper) to form vias for electrical interconnection between the wiring layers on each side of the dielectric layers.

In step 125 (FIG. 2) joining-material 13 (FIG. 4)is deposited on contacts 17 in a similar manner as previously described for step 106 in the process of producing MLC.

Figure 6:
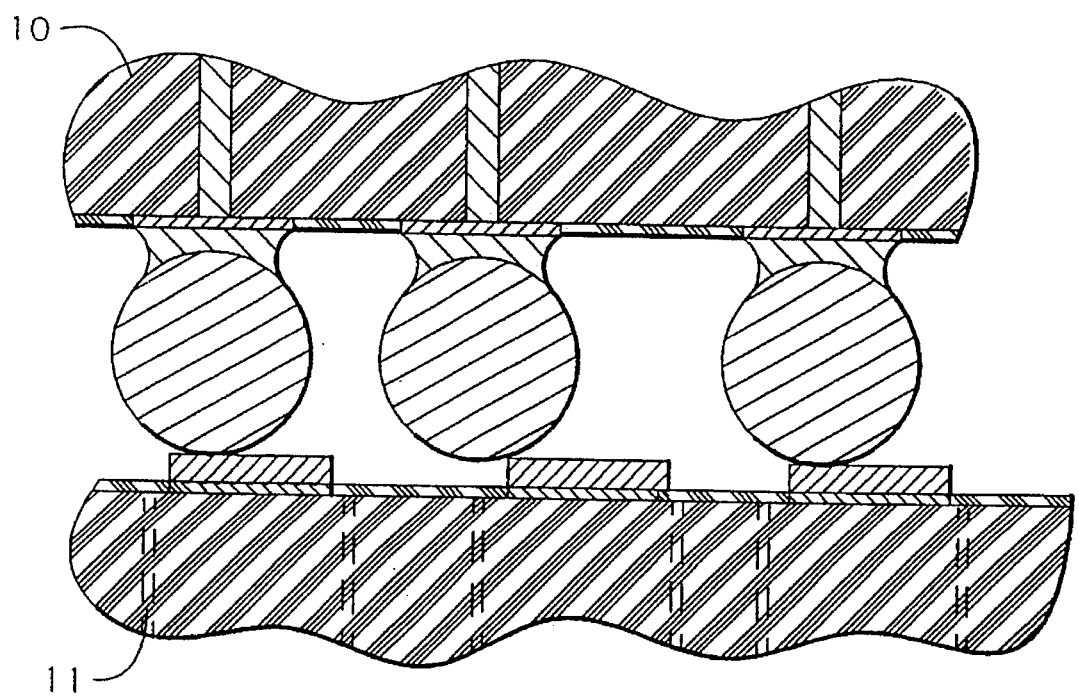
FIG. 6 shows the MLC and FR-4 of FIG. 4 positioned together.

In step 131, substrates 10, 11 are moved into confronting position as shown in FIG. 4, and in step 132, are brought together as shown in FIG. 6. The accuracy of the placement machine is limited so that the substrates are not precisely aligned.

Figure 7:
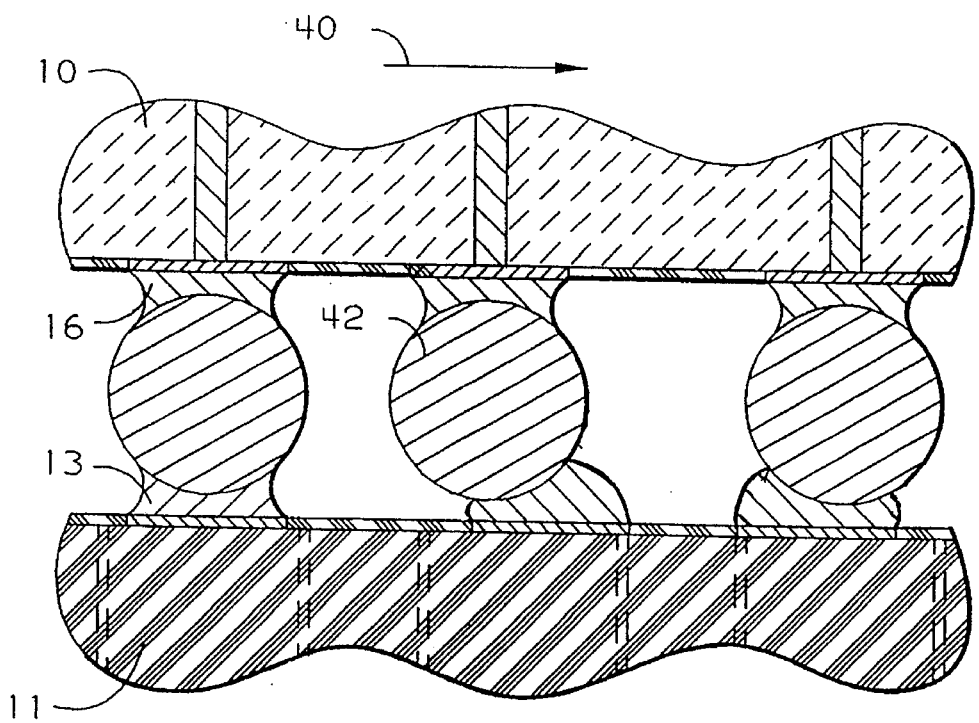
FIG. 7 shows the reflow connections of the MLC to the FR-4 of FIG. 4 in which only the joint between the solder-balls and the FR-4 is melted during reflow.

FIG. 7 shows the results of reflow of only joining-material 13 which moves substrate 10 in the direction of arrow 40 relative to substrate 11 to precisely align the substrates. As illustrated, the connections, such as on either side of ball 42, are not symmetric due to tolerances in the positions of the contacts. Therefore, in step 133, as shown in FIG. 8, preferably both joining-materials 13 and 16 on either side of the solder-balls 18 are simultaneously reflowed to produce more symmetric connections. When both joints 51 and 52 are simultaneously melted the surface tension of the joining-material will move the ball in the plane 53 of the balls toward a position halfway between the centers 54, 55 of the contacts resulting in a more symmetric connection. Such symmetric connections have a greater fatigue life than the non-symmetric connections of FIG. 7.

In step 134, the substrates are cooled to solidify the joining-material of the connections. In step 135, the area between the first and second substrates around the metal-balls is filled with an encapsulant such as epoxy. It is critical to the solder connection configuration invention of applicant that the connections not be encapsulated until after simultaneous reflow of the top and bottom solder joints so that the solder-balls can move into alignment between the contacts. After such alignment encapsulating the area between the substrates, around the balls, further reduces fatigue stress during thermal cycling.

When balls 18 are reflow attached to contacts 12 as shown in FIG. 4, some material will be exchanged between the ball 18 and joining-material 16. For example if the ball is 10/90% Sn/Pb and the joining-material is eutectic 63/37% Sn/Pb then after reflow the joining-material will have a higher Pb content and therefore a higher melting temperature. If joining-material 13 is also eutectic Sn/Pb solder then during reflow for connecting the substrates the joints are going to have to be heated to the higher temperature in order to simultaneously melt both joints. In order to use a minimum temperature for reflow, joining-material 16 may initially have a lead content reduced below eutectic amounts so that during the first reflow it becomes a eutectic mixture and then the simultaneous melting during the second reflow is achieved at minimum temperatures.

Most preferably the balls in FIGS. 4–8 are as large as possible to minimize fatigue stress in the connections only limited by the requirement of reliably preventing bridging between the balls. Stresses in the joints on either side of the balls would be minimized by making the contacts the same size as the balls. However, to reliably prevent bridging between the contacts, the contacts have to be significantly smaller than the balls. As shown in FIG. 8, preferably a solder mask material 58, 59 which repels liquid solder is placed between the contacts to reduce solder bridging so the contacts may be made as close to the size of the balls as possible. For example, connections with 0.9 mm nominal diameter balls and round contacts of 0.7 mm nominal diameter normally spaced at 1.25 mm centers may be made reliably without bridging.

Solder mask materials are well known in the art.

Volumes of LMT joining material should be as large as possible to reduce fatigue, but are limited by the requirements of reliably preventing bridging and of the cost or difficulty in depositing large volumes of solder. Most preferably, as shown in FIG. 9, in plane 62 defined as the cross section of minimum diameter of the joint 64, the minimum joint diameter is at least ⅔ of the diameter of the ball 66. For example if the ball is 0.9 mm in diameter, the joint should be at least 0.6 mm in diameter in plane 62 and more preferably larger.

For ceramic substrates, through-hole vias are usually filled with a HMT metal, and for thin film layers on ceramic, flexible, or FR-4, vias are usually filled or are slightly depressed in relation with contacts that are not on vias. For multi-layer flexible and FR-4 substrates, wiring layers usually contain round lands of metal through which the via holes are formed and which are interconnected between wiring layers by plating the hole. Some of the contacts on FR-4 or flexible substrates may occur on such plated vias. Since the diameter of the solder joint is critical, the volume of solder is critical, but the volume can not easily be controlled at such holes (even if previously filled with LMT solder).

FIG. 10 schematically shows an arrangement of plated through hole vias 71 each connected to a solder contact 72. This "dog bone" arrangement prevents the solder on contact 72 from flowing into the through-hole 73. In this specific embodiment the centers of the contacts are approximately located at the intersections of multiple, equally spaced, parallel lines 74 and multiple, equally spaced, parallel lines 75 which are perpendicular to lines 74. Vias 71 are located at the centers of squares 76 defined by four contacts 72 around via hole 73. The vias are connected to the contacts through a wire 77 extending under a layer of solder mask 78.

FIG. 11 schematically illustrates a single "dog bone" 80 of this invention prior to depositing joining-material on contact 82. A hole 81 (hidden) is made by mechanical or laser drilling from the surface wiring layer into the substrate, at least to another wiring layer, and metal is deposited to form contact 82, land 83, connecting wire 84 and to plate the interior of hole 85 leaving opening 86. Solder mask 87 covers most of connecting wire 84 and the outer edge of land 83 as indicated by dashed lines to prevent solder bridging.

FIG. 12 schematically illustrates an alternative embodiment in which metal contact 91 is larger than metal contact 92. In this case in order to reduce fatigue and increase fatigue life of the connection, a higher volume of joining-material 93 is placed between ball 94 and the smaller contact 92, than the volume of solder material 95 between the solder-ball and larger contact 91. Thus the minimum cross sections of the joints on each side of the solder-ball may be made about equal to equalize fatigue at each joint of the connection.

Figure 13:
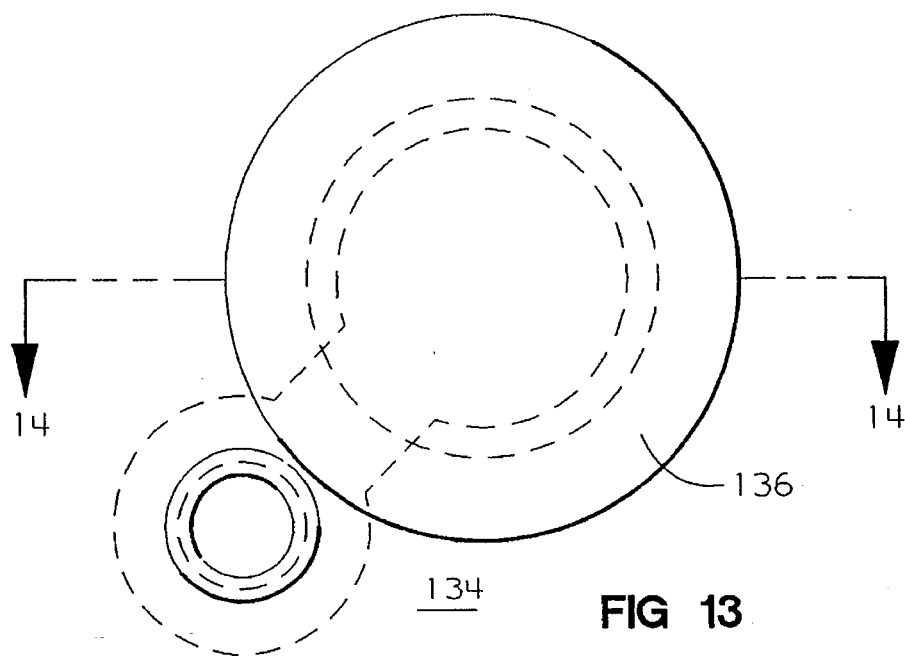
FIG. 13 is a plan view of a flash layer around a contact of this invention for providing sufficient solder volumes for this invention.
Figure 14:
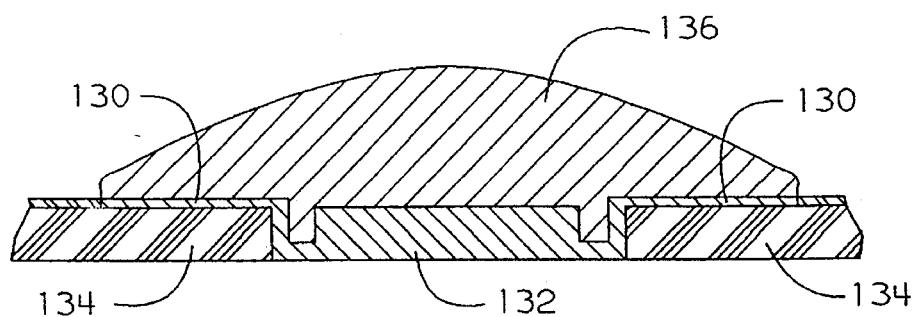
FIG. 14 is a cross section through line 14—14 of FIG. 13 of the contact and flash layer.

FIGS. 13 and 14 illustrate a technique to provide higher levels of solder deposited on a contact than can usually be deposited by wave soldering, electrical, or chemical (electroless) deposition. Flash layer 130 extends out from contact pad 132 over the layer of solder resist 134 the thickness of the flash is exaggerated for illustration. Solder 136 is deposited electrically, chemically, or preferably by melted solder wave. The flash is a conductive substance for electrical deposition, or seed materials such as palladium for electroless plating, a solder wettable material for wave soldering. The thickness of the flash material is selected to completely dissolve the flash during reflow, resulting in all the solder migrating onto contact pad 132. Preferably for wave soldering the flash is copper or tin which is sufficiently thick to survive during deposition, but thin enough to fully dissolve during reflow. The thickness of the solder deposited by molten solder wave generally increases as the size of the flash area increases.

Figure 15:
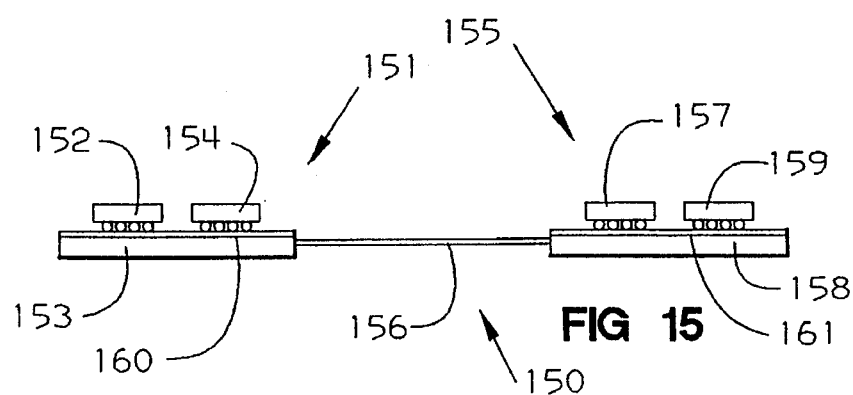
FIG. 15 schematically illustrates the information handling system of this invention.

FIG. 15 shows an information handling system 150 in which computer assembly 151 includes central processor module 152 communicating through one or more wiring layers e.g. a bus 160 in substrate 153 with computer memory module 154 (e.g. RAM). Computer 151 communicates with computer 155 through cable 156. Additional connections (not shown) for cables may be provided for I/O with computer peripherals. Computer 155 also includes central processor module 157 communicating through one or more wiring layers (bus 161) in substrate 158 with computer memory module 159. One or preferably both modules of each computer are connected to the substrate using the preferred solder-ball or solder column connections of the invention.

Figure 16:
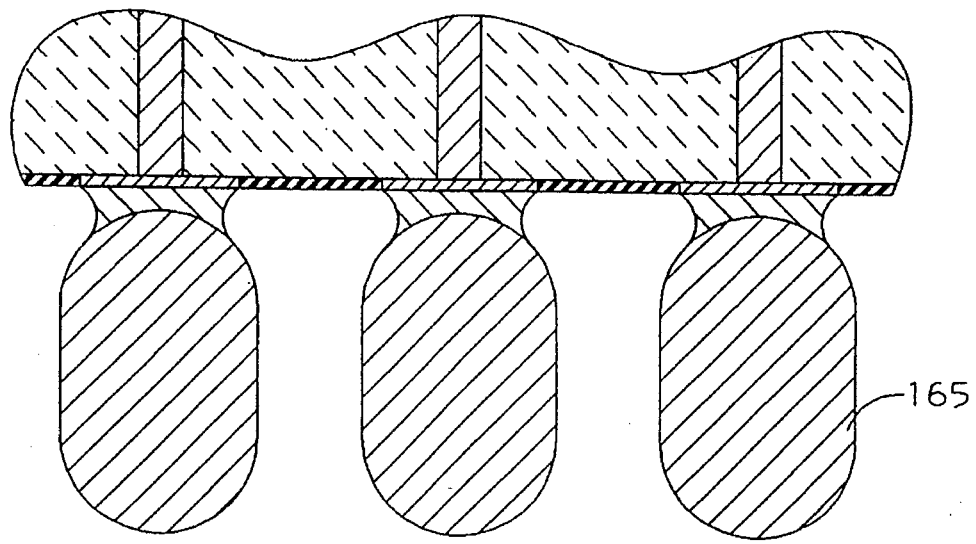

FIG. 16 illustrates solder columns 160 which are similar to the solder-balls 18 (FIG. 4) and the previous discussion on materials, geometries, and methods of placement, reflow joining to the modules, reflow connection to the substrates are applicable. The columns have approximately hemispherical ends and are preferably from 1 to 20 times longer then their diameters. Fatigue is reduced by making the columns longer, but longer columns result in higher module profiles, reduced lead cooling, and handling problems that militate against the length exceeding that necessary to reliably prevent thermal fatigue failures. In this application the term solder-ball includes hemispherical ended solder columns. In order to join the columns to the module, columns may be reflow heated while attached to the bottom side of the module (i.e. inverted position). This results in the columns being closely centered on the contacts and vertically aligned very accurately.

Figure 17:
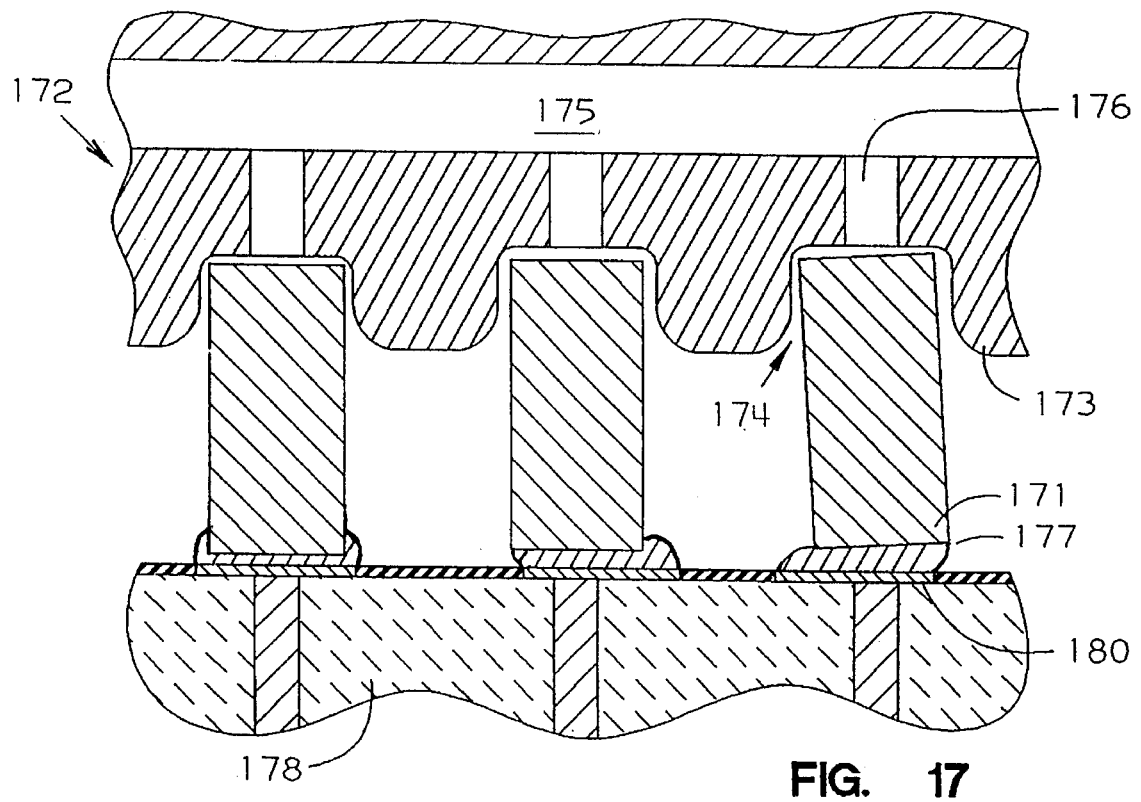

In FIG. 17, columns 171 have square ends formed for example from cutting extruded solder wire. Vacuum die 172 includes a flat face 173 with recesses which fit the solderball or solder column. The recesses 174 communicate with a vacuum reservoir 175 through passages 176 which are significantly smaller than the solder balls or columns to reliably prevent the columns from entering vacuum reservoir 175 and to prevent jamming. The vacuum die is used to position the balls or columns on the contacts of substrate 178 either as shown in FIG. 17 or in an inverted position. Either round or square end columns can be reflow joined in inverted position as in FIG. 16 or by holding the columns vertical during reflow preferably using the vacuum die. The vacuum can be turned off or even reversed during reflow allowing the columns to rest against the solder contacts.

Figure 19:
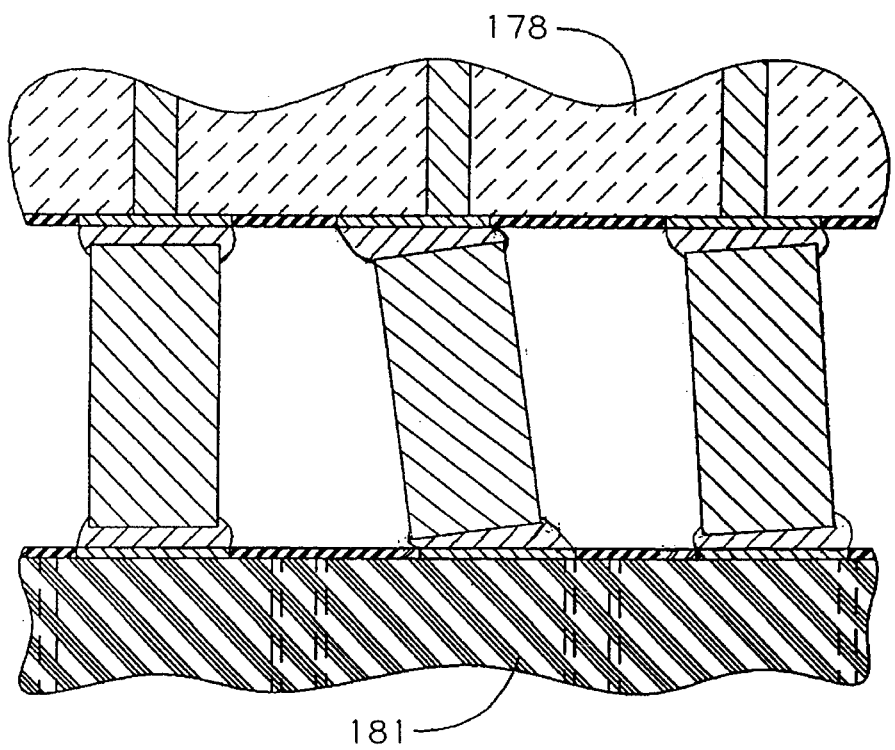
Figure 18:
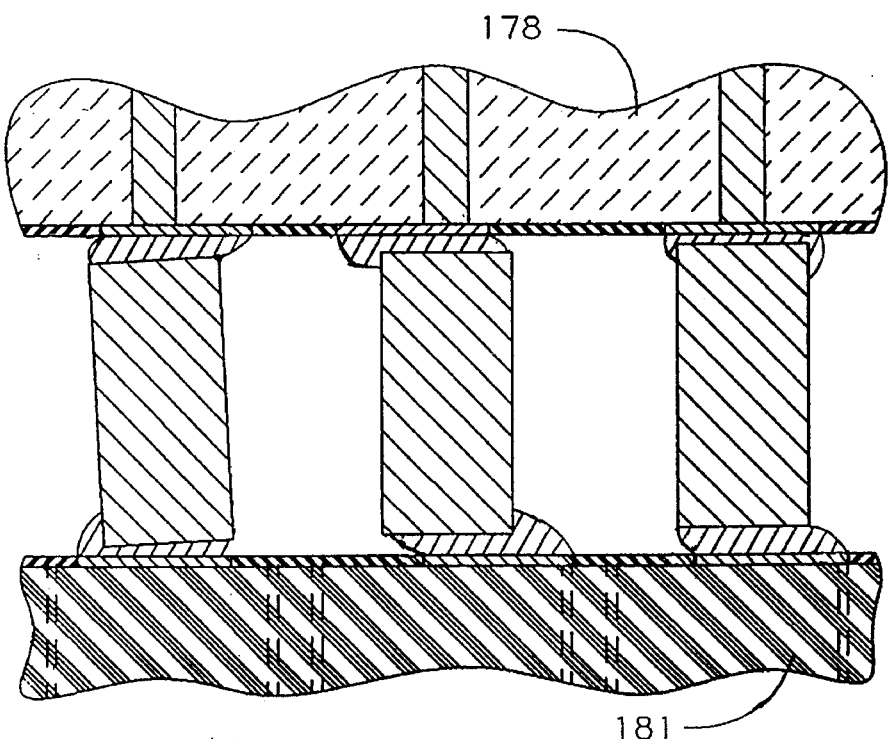

When the round or square columns are held in position during reflow joining with the contacts 180 of substrate 178, the columns are not as well centered on the contacts, or as vertically aligned or vertically positioned as the joints formed by hanging (FIG. 16). As shown in FIG. 18, when the module substrate is connected to another substrate 181 the joints are not symmetrical. When the simultaneous reflow of the invention is applied as shown in FIG. 19, the joints become much more symmetrical and more reliable.

While this invention has been described in relation to preferred embodiments, it will be understood by those skilled in the art that changes in the details of processes and structures may be made without departing from the spirit and scope of this invention.

What we claim is:

1. An interconnect assembly comprising:

a first and second interconnect substrates;

a planer pattern of multiple, metal contacts on each respective substrate, for interconnection between the substrates, which are mirror images of each other to provide multiple confronting pairs of contacts;

balls of conductive metal for respective pairs of such contacts with a ball diameter about the same as the width of the contacts; and a volume of a first joining-material for each such pair of contacts connected to the respective contact of the first interconnect substrate and a volume of a second joining-material for each such pair of contacts connected to the respective contact of the second interconnect substrate, with melting temperatures of the joining-materials of both the first and second volumes substantially less than the melting temperature of the metal-balls, with the first and second volumes of each pair of contacts connected to approximately diametrically opposite ends of a respective metal-ball, and with the smallest cross sectional area of each joining-material volume having a minimum diameter at least about ⅔ of the diameter of the metal-ball.

2. The assembly of claim 1, in which the diameter of the metal-balls and width of the contacts are about 0.6 mm to about 1.2 mm and the minimum diameter of such cross-section of each joining-material volume is at least about 0.6 mm.

3. The assembly of claim 2, in which the contacts are round with a diameter of about 0.7 mm and the diameter of the metal-balls is about 0.9 mm.

4. The assembly of claim 3, in which the alloy of the metal-ball includes about 80% to about 97% Pb with most all the balance being Sn.

5. The assembly of claim 4, in which the alloy of the metal-ball is from about 90% to about 95% Pb.

6. The assembly of claim 1, in which:

the positions of the contacts are defined by intersections of a multitude of about parallel and about equally spaced lines in each of two about perpendicular directions in a plane of the surface at the contacts; and the first interconnect substrate further includes:

multiple wiring layers including one on a major surface of the substrate in which the contacts are positioned;

a multitude of conducting vias connecting between one or more other wiring layers of the substrate and the surface wiring layer at about the centers of squares defined by four of the contacts; and a conductor of the surface wiring layer for each respective via, which is substantially narrower than the contacts; and extends in a diagonal direction of the square to connect between the via and one of the four contacts surrounding the via.

7. The assembly of claim 6, in which:

the surface wiring layer containing the contacts further includes lands surrounding the vias;

the conductors extend from the lands to the conductors; and the via through-holes are internally plated with a layer of copper sufficiently thick to connect electrically between the lands and other wiring layers of the structure.

8. A fabricated interconnect assembly comprising:

a first and second interconnect substrates;

a planer pattern of multiple, metal contacts on each respective substrate, for interconnection between the substrates, which are mirror images of each other to provide confronting pairs of contacts;

a ball of conductive metal for respective pairs of such contacts with a diameter about the same as the width of the contacts; and a volume of a first joining-material for each such pair of contacts connected to the respective contact of the first interconnect substrate and a volume of a second joining-material for each such pair of contacts connected to the respective contact of the second interconnect substrate, with melting temperatures of the first and second joining-materials both substantially less than the melting temperature of the metal-balls, with the volumes of the first and second joining-materials of each pair of contacts connected to approximately diametrically opposite ends of a respective metal-ball, and with the melting temperatures of the first and second joining-materials being about equal.

9. The assembly of claim 8, in which:

the alloy of the metal-ball is from about 85% to about 97% Pb and most of the balance being Sn; and the joining-material includes about 37/63 percent Pb/Sn solder alloy.

10. The assembly of claim 9, in which the joining-material is about 65 to about 75 percent Sn.

11. An interconnect structure for connection to a plane of contacts comprising:

a substrate;

a planer pattern of multiple, metal contacts for interconnecting the substrate, to another substrate with a mirror image pattern of contacts;

balls of conductive metal for respective contacts with ball a diameter about the same as the width of the contacts with confronting ends of the balls at respective contacts and distal, exposed ends for connection to the mirror image contacts of another substrate; and an isolated volume of a joining-material connected between the confronting end of each metal ball and the respective contact for that metal ball, with a melting temperature of the joining-material substantially less than the melting temperature of the metal-ball, and with the smallest cross sectional area of the joining-material volumes having a minimum diameter at least about ⅔ of the diameter of the metal-ball.

12. The structure of claim 11, in which the diameter of the metal-ball and width of the contacts are about 0.6 mm to about 1.2 mm and the minimum diameter of such cross-section of each joining-material volume is at least about 0.6 mm.

13. The structure of claim 12, in which the diameters of the contacts are from about 15% to about 30% smaller than the diameters of the metal-balls.

14. The structure of claim 13, in which the diameter of the metal-ball is about 0.9 mm and width of the contacts are about 0.7 mm.

15. The structure of claim 11, in which the alloy of the metal-balls includes more than 90% up to about 97% Pb with substantially all the balance being Sn.

16. The structure of claim 15, in which the alloy of the metal-balls is about 95% Pb.

17. A fabricated interconnect structure comprising:
a multi-layer substrate having a wiring layer at the surface of the substrate;
a multitude of metal contacts in a matrix at positions in the wiring layer defined by intersections of a grid of a multitude of approximately parallel about equally spaced lines in each of two about perpendicular directions in a plane of the surface wiring layer;
a multitude of conducting vias connecting between one or more other wiring layers of the substrate and the surface wiring layer at about the centers of squares defined by four of the contacts; and
a conductor of the surface wiring layer for each respective via, which is narrower than the contacts, and extends in a diagonal direction of the square to connect between the via and one of the four contacts surrounding the via.

18. An information handling system comprising:
one or more central processing units connected in a network;
random access memory communicating through a bus with each central processor unit;
input/output means for communication between processor units and with computer peripherals;
a circuit board in communication with one or more of the central processing units, with a planer pattern of round, metal contacts having a diameter of about 0.6 mm to about 1.0 mm on a major surface;
a chip carrier for one or more chips, with a planer pattern of multiple, metal contacts on a major surface, which pattern is approximately a mirror image of a planer pattern of contacts on the circuit board to provide confronting pairs of contacts for interconnection between the carrier and the board and which are also about 0.5 mm to about 1.0 mm in width;
a metal-ball for each respective pair of such contacts with a diameter of about 0.6 mm to about 1.3 mm; and
a volume of a first joining-material for each pair of contacts connected to a respective contact of the chip carrier and a volume of a second joining-material for each pair of contacts connected to a respective contact of the circuit board, with melting temperatures of both the first and second joining-material substantially less than the melting temperature of the metal-balls, with the first and second joining-materials of each pair of contacts soldered to diametrically opposite ends of the respective metal-ball.

19. The system of claim 18, in which:
the circuit board is multi-layered;
the positions of the contacts are defined by intersections of a multitude of approximately parallel about equally spaced lines in each of two about perpendicular directions in a plane of the surfaces at the contacts; and
the circuit board further includes:
a multitude of wiring layers including one on the surface in which the contacts of the circuit board are positioned;
a multitude of plated through-holes connecting between one or more other wiring layers of the circuit board and the surface wiring layer for soldering to the metal-balls; and
means to control the minimum diameter of the solder volume of soldered connections for the vias including:
a circular via land contact in the surface wiring layer for each respective via connected to the end of each via at the surface;
positioning the connections of the vias with the surface wiring layer at about the centers of squares defined by four of the contacts;
a metal conductor of the surface wiring layer for each respective via, which is substantially narrower than the contacts, and extends in a diagonal direction of the square to connect between the via land and one of the four contacts surrounding the via land; and
a covering of solder resist over the lands and conductors and which provides windows for the contacts.

20. Information handling apparatus comprising:
one or more central processing units connected in a network;
random access memory communicating through a bus with each central processor unit;
input/output means for communicating with computer peripherals;
a multi-layer circuit board in communication with one or more of the central processing units, having a wiring layer on the surface of the circuit board;
a multitude of metal contacts in a planer matrix pattern at positions defined by intersections of a grid of a multitude of approximately parallel about equally spaced lines in each of two perpendicular directions in a plane of the surface wiring layer;
a multitude of conducting vias connecting between one or more other wiring layers of the circuit board and the surface wiring layer at about the centers of squares defined by four of the contacts;
a conductor of the surface wiring layer for each respective via, which is narrower than the contacts, and extends in a diagonal direction of the square to connect between the via and one of the four contacts surrounding the via;
a chip carrier for one or more chips with a planer pattern of multiple, metal contacts on a major surface which is approximately a mirror image of a planer pattern of contacts on the circuit board to provide confronting pairs of contacts for interconnection between the carrier and the board;
a metal-ball for each respective pair of such contacts; and
a volume of a first joining-material for each pair of contacts connected to a respective contact of the chip carrier and a volume of a second joining-material for each pair of contacts connected to a respective contact of the circuit board, with melting temperatures of both the first and second joining-material substantially less than the melting temperature of the metal-balls, with the first and second joining-materials of each pair of contacts soldered to diametrically opposite ends of the respective metal-ball.

21. Interconnect apparatus comprising:

a first and second interconnect substrates;

a planer pattern of multiple, metal contacts on each respective substrate for interconnection between the substrates, which are mirror images of each other to provide confronting pairs of contacts;

a column of conductive metal for respective pairs of such contacts with a diameter about the same as the width of the contacts and positioned with a longitudinal axis perpendicular to the plane of contacts; and a volume of a first joining-material for each such pair of contacts connected to the respective contact of the first interconnect substrate and a volume of a second joining-material for each such pair of contacts connected to the respective contact of the second interconnect substrate, with melting temperatures of the joining-materials of both the first and second volumes substantially less than the melting temperature of the metal-columns, with the first and second volumes of each pair of contacts connected to opposite ends of a respective metal-column.

22. The apparatus of claim 21, in which:

the positions of the contacts are defined by intersections of a multitude of approximately parallel and about equally spaced lines in each of two about perpendicular directions in a plane of the surface at the contacts; and the first interconnect substrate further includes:

multiple wiring layers including one on a major surface of the substrate in which the contacts are positioned;

a multitude of conducting vias connecting between one or more other wiring layers of the substrate and the surface wiring layer at about the centers of squares defined by four of the contacts; and a conductor of the surface wiring layer for each respective via, which is substantially narrower than the contacts, and extends in a diagonal direction of the square to connect between the via and one of the four contacts surrounding the via.

23. The apparatus of claim 22, in which:

the surface wiring layer containing the contacts further includes lands surrounding the vias;

the conductors extend from the lands to the conductors; and the via through-holes are internally plated with a layer of copper sufficiently thick to connect electrically between the lands and other wiring layers of the structure.

24. Fabricated interconnect apparatus comprising:

a substrate;

a planer pattern of multiple, metal contacts for interconnecting the substrate to another substrate with mirror image contacts;

a column of conductive metal for each contact with a diameter about the same as the width of the contacts and positioned about perpendicular to the plane of contacts; and a volume of a joining-material connected between each respective contact and the respective metal-column for that contact, with a melting temperature of the joining-material substantially less than the melting temperature of the metal-column.

25. The apparatus of claim 24, in which the alloy of the metal-column includes about 80% to about 97% Pb with substantially all the balance being Sn.

26. The apparatus of claim 25, in which the alloy of the metal-column is from about 90% to about 95% Pb.

27. An interconnect structure comprising a first substrate with a first about planer area array of contacts and a second substrate with a second about planer area array of contacts, which second array is about parallel to the plane of the first area array of contacts in positions corresponding to positions of the first area array of contacts; and solder extending between a pair of corresponding contacts, including a first and second cross-sections parallel to the plane of the contacts, with a narrower width than either of the respective contacts of the pair; and a third cross-section parallel to the plane of the contacts, between the first and second cross-sections, with a width wider than the width of either of the respective contacts of the pair.

28. The structure of claim 27 in which the solder at the first and second cross-sections has a substantially lower melting temperature than the solder at the third cross-section.

* * * * *